(12) United States Patent
Torabi et al.

(10) Patent No.: US 11,349,310 B2
(45) Date of Patent: May 31, 2022

(54) ADAPTIVE CONTROL TECHNIQUE FOR STABILITY OF IMPEDANCE INJECTION UNIT

(71) Applicant: Smart Wires Inc., Union City, CA (US)

(72) Inventors: Niloofar Torabi, Menlo Park, CA (US); Haroon Inam, San Jose, CA (US)

(73) Assignee: Smart Wires Inc., Union City, CA (US)

( * ) Notice: Subject to any disclaimer, the term of this patent is extended or adjusted under 35 U.S.C. 154(b) by 1 day.

(21) Appl. No.: 16/918,824

(22) Filed: Jul. 1, 2020

(65) Prior Publication Data

US 2021/0151986 A1 May 20, 2021

Related U.S. Application Data

(60) Provisional application No. 62/936,101, filed on Nov. 15, 2019.

(51) Int. Cl.
| | |
|---|---|
| *H02J 3/18* | (2006.01) |
| *H02J 3/12* | (2006.01) |
| *H03L 7/093* | (2006.01) |
| *H02J 3/20* | (2006.01) |

(52) U.S. Cl.
CPC .................... *H02J 3/18* (2013.01); *H02J 3/12* (2013.01); *H02J 3/1814* (2013.01); *H02J 3/20* (2013.01); *H03L 7/093* (2013.01)

(58) Field of Classification Search
CPC .... H02J 3/12; H02J 3/18; H02J 3/1814; H02J 3/20; H03L 7/093
See application file for complete search history.

(56) References Cited

U.S. PATENT DOCUMENTS

| | | | |
|---|---|---|---|
| 6,175,285 B1 | 1/2001 | Gabara | |
| 6,242,895 B1 * | 6/2001 | Fujii | ........................ G05F 1/70 323/207 |
| 6,249,192 B1 | 6/2001 | Gabara et al. | |
| 6,317,008 B1 | 11/2001 | Gabara | |
| 6,919,746 B2 | 7/2005 | Suzuki | |
| 6,954,092 B2 | 10/2005 | Suzuki | |

(Continued)

FOREIGN PATENT DOCUMENTS

| | | | | |
|---|---|---|---|---|
| EP | 1133043 A1 * | 9/2001 | ............ | H02J 3/1814 |
| EP | 3518366 A2 * | 7/2019 | ............ | H02M 5/293 |

*Primary Examiner* — Fred E Finch, III

(74) *Attorney, Agent, or Firm* — Womble Bond Dickinson (US) LLP

(57) ABSTRACT

Transients occur on power transmission lines for unpredictable reasons including breakers opening and closing, load variations, and inputs to the grid from renewable energy sources turning on and off. A recursive technique allows a linear function to be fitted to a non-linear grid dynamic of the power line transients. The technique is adaptive and helps to stabilize an impedance injection unit while it injects correcting impedance into a transmission line for the purpose of achieving power flow control. When applied to many injection units the technique may also help to stabilize the overall grid. The stabilization system using the recursive technique provides real-time monitoring of the associated power line and stabilization with respect to power line transients.

20 Claims, 4 Drawing Sheets

(56) References Cited

U.S. PATENT DOCUMENTS

| | | | |
|---|---|---|---|
| 6,960,949 B2 | 11/2005 | Suzuki | |
| 7,940,033 B2 | 5/2011 | Dowlatabadi | |
| 8,604,768 B2 | 12/2013 | Dowlatabadi | |
| 2004/0130364 A1 | 7/2004 | Suzuki | |
| 2004/0212356 A1 | 10/2004 | Dowlatabadi | |
| 2005/0162201 A1 | 7/2005 | Suzuki | |
| 2005/0162202 A1 | 7/2005 | Suzuki | |
| 2011/0187425 A1* | 8/2011 | Mika | H03L 7/1075 327/157 |
| 2011/0273150 A1 | 11/2011 | Dowlatabadi | |
| 2012/0179301 A1* | 7/2012 | Aivaliotis | H02J 3/00 700/286 |
| 2015/0077145 A1* | 3/2015 | Barnes | G01R 27/16 324/707 |
| 2018/0351361 A1* | 12/2018 | Miyake | H02J 3/12 |
| 2019/0190402 A1* | 6/2019 | Kamatani | H02M 7/53871 |
| 2019/0237971 A1* | 8/2019 | Inam | H02J 3/18 |
| 2020/0067309 A1* | 2/2020 | Ginart | H02J 13/00004 |
| 2020/0395756 A1* | 12/2020 | Harrington | H02J 3/28 |

* cited by examiner

ADAPTIVE CONTROL TECHNIQUE FOR STABILITY OF IMPEDANCE INJECTION UNIT

CROSS REFERENCE TO RELATED APPLICATIONS

This application claims the benefit of U.S. Provisional Application No. 62/936,101 filed on Nov. 15, 2019, the disclosure of which is incorporated herein by reference in its entirety.

TECHNICAL FIELD

This disclosure relates generally to power distribution systems, and in particular to stabilization systems and methods for use in an impedance injection unit of a power flow control system.

BACKGROUND

Modern-day distributed power generation introduces multi-generator grids and new modes of operation. These new modes of operation will likely introduce power electronic (PE) converters, such as impedance injection units, on a large scale at the low- and medium-voltage levels. Transients occur on power transmission lines for unpredictable reasons including breakers opening and closing, load variations, and inputs to the grid from renewable energy sources turning on and off. The power line transients may be manifested as non-linear anomalies in grid current. There is a need in the art for power flow control systems that can adapt to changing grid dynamics while working to stabilize the impedance injection units of the power flow control systems.

SUMMARY

Disclosed herein is an apparatus of an impedance injection unit that is connected to a power transmission line, such as the stabilization system of the impedance injection unit. The apparatus includes a DC capacitor, a power switching assembly and a controller. The controller monitors the voltage on the DC capacitor and the phase of a line current flowing through the power transmission line to detect power flow anomalies of the power transmission line. The controller also computes a correcting impedance based on the monitored voltage of the DC capacitor and the phase of the line current. The controller further commands the power switching assembly to inject the correcting impedance into the power transmission line to stabilize the power flow of the power transmission line in response to anomalies of the power transmission line.

Disclosed herein is an apparatus of an impedance injection unit that is connected to a power transmission line. The power transmission line is part of a power grid. The apparatus includes a controller, a memory, a phase locked loop, a power switching assembly, and a pulse width modulator. The phase locked loop locks to the phase of the line current flowing through the power transmission line. The power switching assembly is used to inject an impedance onto the power transmission line. The pulse width modulator is used to generate DC pulses that determine the injected impedance. The controller executes instruction contained in the memory to adaptively control the phase locked loop, the power switching assembly, and the pulse width modulator to inject the impedance onto the power transmission line in response to dynamics of the power transmission line.

Disclosed also is a method for an impedance injection unit to stabilize power flow of a power transmission line. The impedance injection unit includes a controller and a DC capacitor that stores energy to be injected onto the power transmission line. The method includes detecting, by the controller, the voltage on the DC capacitor and the phase of the line current flowing through the power transmission line to detect power flow anomalies of the power transmission line. The method also includes computing, by the controller, a correcting impedance based on the detected voltage of the DC capacitor and the phase of the line current. The method also includes adaptively adjusting, by the controller, the correcting impedance by recursively adjusting parameters of the impedance injection unit in response to dynamics of the power transmission line. The method further includes injecting the correcting impedance onto the power transmission line

BRIEF DESCRIPTION OF THE DRAWINGS

The accompanying drawings are provided together with the following description of various aspects and embodiments of the subject technology for a better comprehension of the invention. The drawings and the embodiments are illustrative of the invention and are not intended to limit the scope of the invention. It is understood that a person of ordinary skill in the art may modify the drawings to generate drawings of other embodiments that would still fall within the scope of the invention.

DETAILED DESCRIPTION

Examples of various aspects and variations of the subject technology are described herein and illustrated in the accompanying drawings. Objects, features, and advantages of the invention will be apparent from the following detailed description taken in conjunction with the accompanying drawings. While various embodiments of the subject technology are described, the following description is not intended to limit the invention to these embodiments, but rather to enable a person skilled in the art to make and use this invention Transients occur on power transmission lines for unpredictable reasons including breakers opening and closing, load variations, and inputs to the grid from renewable energy sources turning on and off. Disclosed is a recursive technique that allows a linear function to be fitted to a non-linear grid dynamic of the power line transients. The technique is adaptive and helps to stabilize a power flow control unit such as an impedance injection unit while it injects correcting impedance into a transmission line. When applied to many impedance injection units the technique may also help to stabilize the overall grid. A stabilization system employing the recursive technique provides real-time monitoring of the associated power line and stabilization with respect to power line transients.

Figure 1:
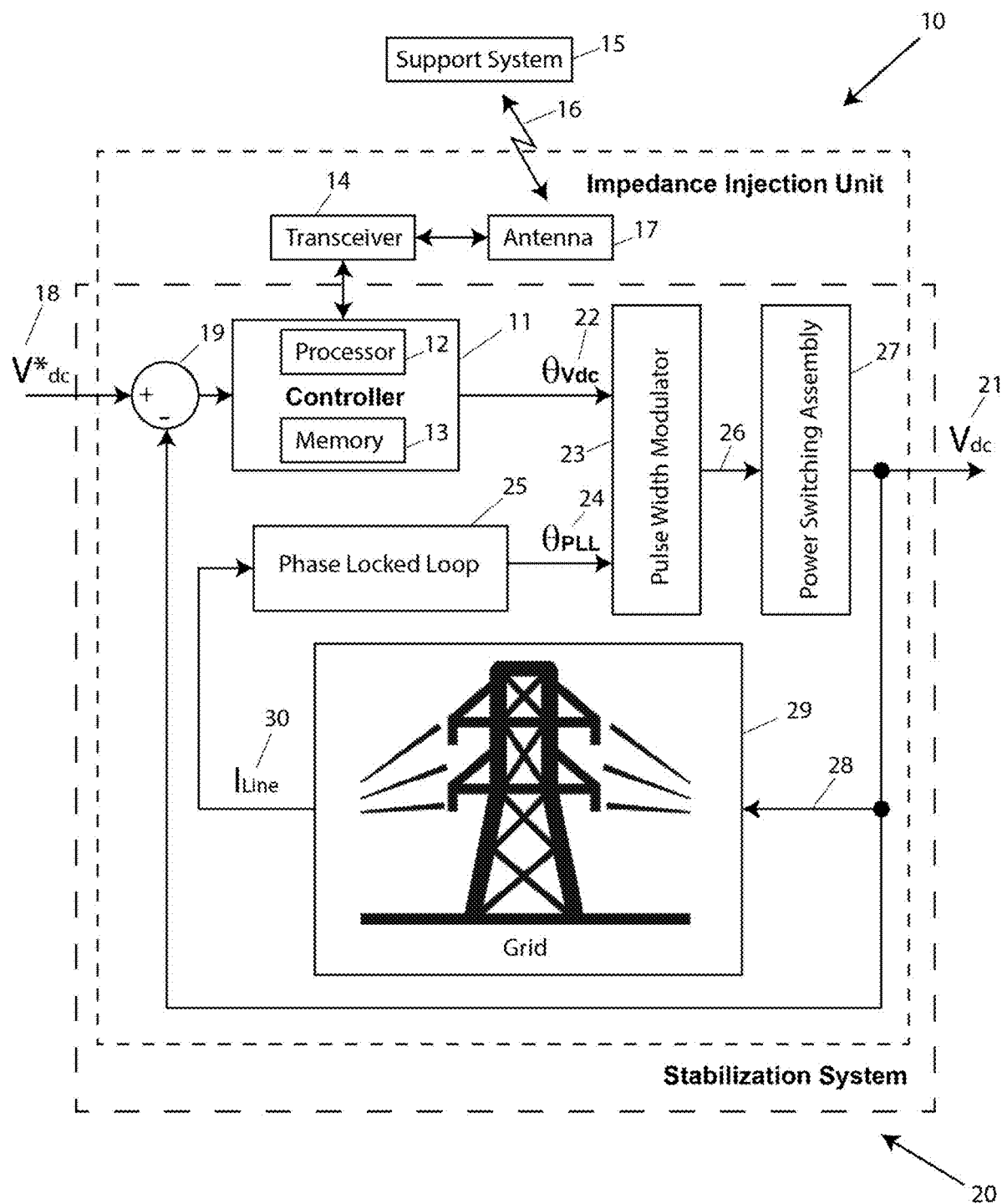
FIG. 1 is a control flow diagram of an impedance injection unit incorporating an exemplary stabilization system according to one embodiment.

FIG. 1 is a control flow diagram showing a power flow control unit such as an impedance injection unit 10 in which a stabilization system 20 is implemented according to one embodiment. Impedance injection unit 10 includes a controller 11 comprising a processor 12 and a memory 13. Processor 12 executes instructions contained in memory 13 to control stabilization system 20. Controller 11 is coupled to a transceiver 14 which is further coupled to an external support system 15 through a radio frequency link 16 via antenna 17. Configuration and operating parameters may be passed to impedance injection unit 10 and stabilization system 20 from external support system 15. In one embodiment, external support system 15 may be operated by a grid operator to configure and control the operations of multiple impedance injection units 10. Stabilization system 20 may include a voltage comparator 19, a phase locked loop 25, a pulse width modulator 23, and a power switching assembly 27.

V*dc 18 is a first input to voltage comparator 19 in stabilization system 20. It is the desired or the reference value of injection voltage Vdc and may be provided by the grid operator. Vdc 21 is an output of stabilization system 20 that is fed back to a second input to voltage comparator 19 to be compared with V*dc 18. Vdc 21 is injected into a single-phase transmission line of a power distribution grid 29 as shown, in order to apply a power flow correction. In one embodiment, Vdc 21 may be the voltage across a DC capacitor used to generate DC pulses that are injected into the single-phase transmission line of power distribution grid 29 by power switching assembly 27. Controller 11 outputs θVdc 22 to pulse width modulator 23, which also receives an input θPLL 24 from phase locked loop 25. Phase locked loop 25 may lock on the phase of line current ILine 30 of the transmission line to fit a linear function to the non-linear grid dynamic of the transmission line transients. Pulse width modulator 23 produces DC pulses to be applied to a power transmission line through power switching assembly 27, to achieve the desired power flow injection in the transmission line. In one embodiment, pulse width modulator 23 adds θVdc 22 to the θPLL 24 to determine the frequency and amplitude of the DC pulses. Power switching assembly 27 feeds the injected DC pulses on Vdc 21 by path 28 into a single-phase power transmission line of the grid 29, producing the current Thine 30 which is fed back to phase locked loop 25 as shown. Stabilization system 20 implements a recursive technique employing phase locked loop 25 to fit a linear function to potentially non-linear behavior of grid 29.

Figure 2:
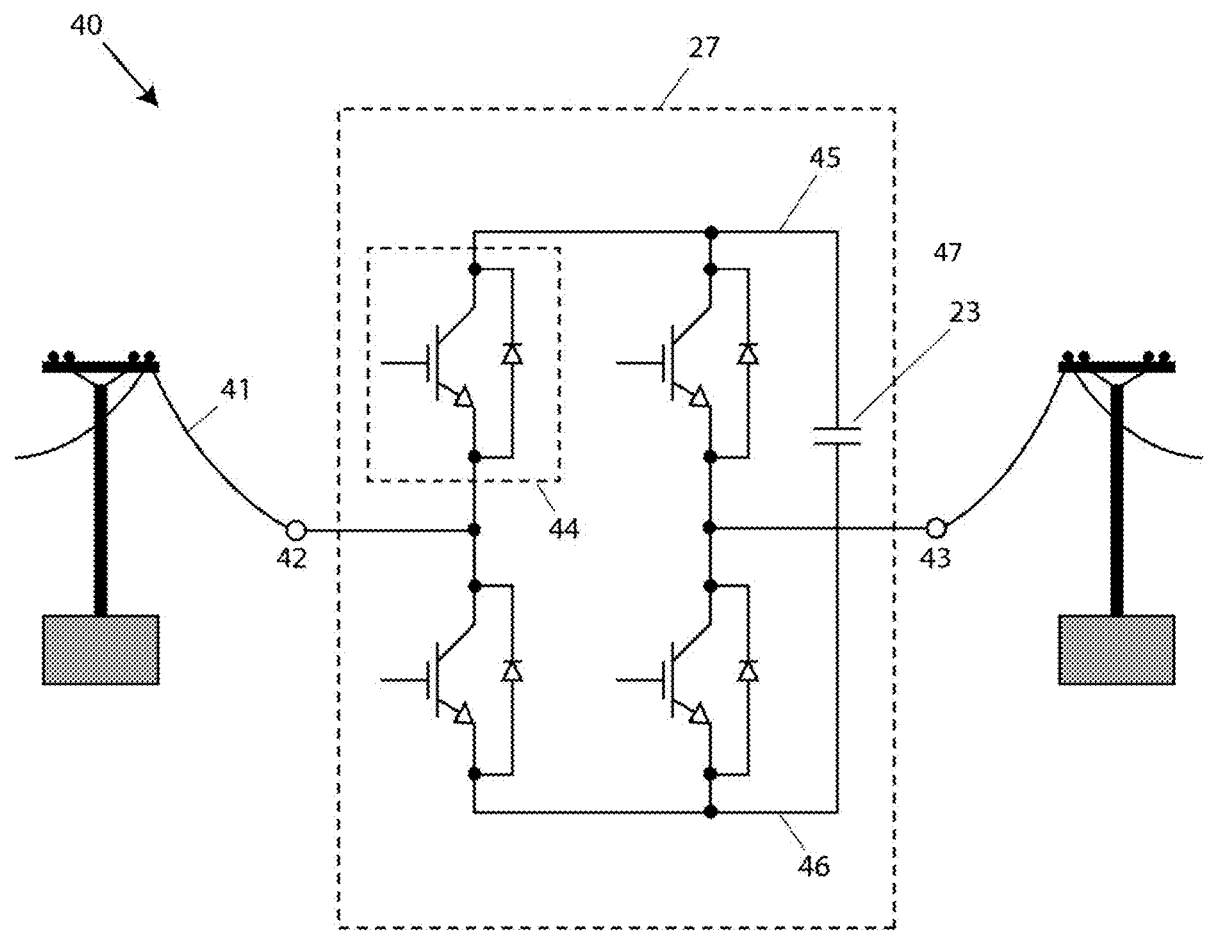
FIG. 2 is a circuit diagram showing high current switching devices of a power switching assembly of an impedance injection unit connected to a DC capacitor, and to a power transmission line according to one embodiment.

FIG. 2 is a circuit diagram 40 showing a power transmission line 41 together with the power switching assembly 27 of FIG. 1 according to one embodiment. Connections 42, 43 of power switching assembly 27 to power transmission line 41 are shown. Transmission line 41 may be one phase of the transmission grid 29. Power switching assembly 27 includes high-current switching devices 44 which may be implemented as IGBTs (insulated gate bipolar transistors) as shown. Additional connections 45 and 46 are shown to a DC capacitor 47. During operation, DC capacitor 47 is charged with DC pulses that are injected into power transmission line 41 using the high current switching devices 44 of power switching assembly 27. In one embodiment, alternating pairs of switching devices 44 are turned on to inject the voltage of DC capacitor 47 as positive-going and negative-going half-cycles of DC pulses into the power transmission line 41. Furthermore, the stabilization system 20 of FIG. 1 monitors the voltage VDC 21 on DC capacitor 47 to detect anomalies in relation to the phase of line current Thine 30, computes a correcting impedance in controller 11, and injects the correcting impedance into power transmission line 41. This increases the stability of impedance injection unit 10 and contributes to stability in the grid 29. The real-time monitoring of VDC 21 and the phase of line current ILine 30, together with the processing power of stabilization system 20, provides real-time monitoring of the stability of impedance injection unit 10 and stability of the grid 29.

Figure 3:
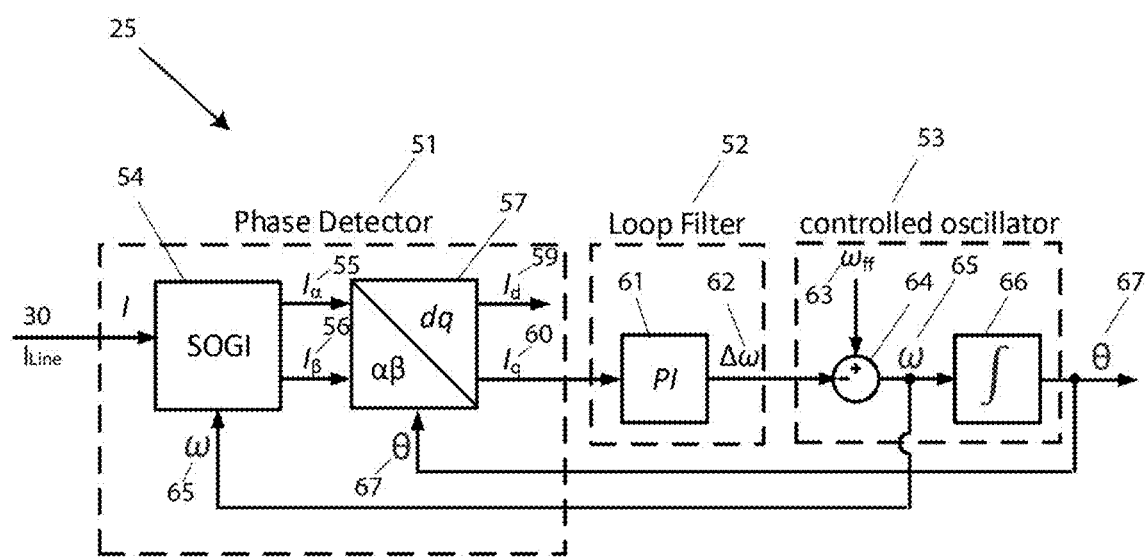
FIG. 3 is a control flow diagram showing details of a phase locked loop used in the stabilization system of FIG. 1 according to one embodiment.

FIG. 3 is a control flow diagram describing the internals of the phase locked loop 25 of FIG. 1 according to one embodiment. Phase locked loop 25 includes a phase detector 51, a loop filter 52 and a controlled oscillator 53. Controlled oscillator 53 oscillates at a frequency controlled by its input. In further detail, line current ILine 30 is an input to a second order generalized integrator (SOGI), 54, having outputs Iα 55 and Iβ 56. Iα 55 and Iβ 56 are first and second components in an orthogonal stationary reference frame. In one embodiment, Iα 55 and Iβ 56 are the projections of the difference in phase between ILine 30 and frequency ω 65 from controlled oscillator 53 onto the two axis of the orthogonal stationary reference frame that will be rotated around a third axis. Block 57 performs a Park transformation to convert vectors in a balanced two-phase orthogonal stationary system into an orthogonal rotating reference frame, with outputs Id 59 and Iq 60. Iq 60 represents the difference in phase between inputs ILine 30 and ω 65 to the SOGI 54. Iq 60 is input to proportional integrator 61 having output Δω 62, where Δω 62 is the angular frequency error. In one embodiment, the proportional integrator 61 may integrate Id 59, which is orthogonal to Iq 60 to generate Δω 62. Δω 62 is input to comparator 64 of controlled oscillator 53 having a second input ωff 63, where ωff 63 is a reference angular frequency. The output of comparator 64 is angular frequency ω 65, which represents the difference between Δω 62 and the reference angular frequency ωff 63 and is an input to integrator 66 to create output θ 67, which is the phase of the input signal ILine 30. ω 65 feeds back to SOGI 54 as shown, and θ 67 feeds back to block 57 as an input to the Park transformation. Thus, phase locked loop 25 implements a 4$^{th}$ order transfer function, including a recursive least squared fit to fit a linear function to a non-linear grid dynamic of the transients on transmission line current ILine 30.

It has been shown how the stabilization system 20 monitors the voltage on the DC capacitor 47 to detect system anomalies in relation to the phase of line current (Thine 30) flowing in the transmission line, computes a correcting impedance in the controller 11, and injects the correcting impedance into the transmission line, thereby increasing stability in the impedance injection unit 10.

Advantageously, the integrated behavior of the power switching assembly 27, the phase-locked loop 25, the pulse width modulator 23, and the controller 11 in response to the dynamic grid is adaptive, despite non-linear transitions that may occur in one or more system components of the grid 29. Stabilization system 20 is operable to monitor in real-time the stability of the integrated system comprising all of these components and is further operable to stabilize them in response to a variety of anomalies that may occur. The anomalies in grid current may occur due to alternate power systems coming on or off-line for example. Anomalies may also occur in the behavior of an impedance injection unit, for example as a result of component failure or degradation. This component failure or degradation may or may not be critical to system operation.

Stabilization system 20 will respond to a grid anomaly with a response time of around 1 second. For stability, this response time is slower than many transients on the grid. It is also slower than the cycle time of the controller. However, the speed of this system response is fast enough to attend to many anomalies without requiring shutdown of associated transmission lines in the power distribution system (power grid), an object of the present disclosure.

Figure 4:
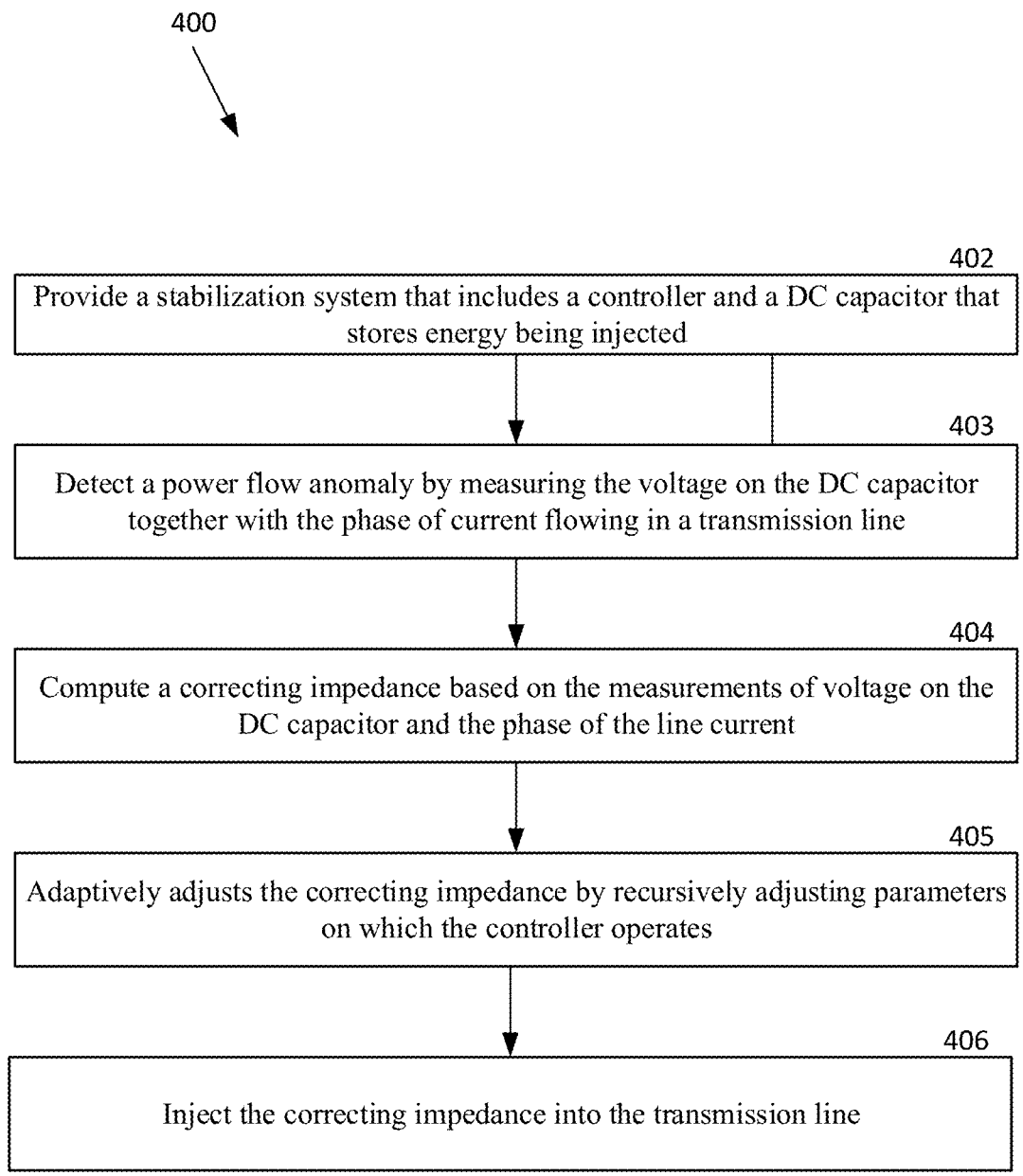
FIG. 4 is a flow chart of an exemplary method for stabilizing an impedance injection unit applied to a power transmission line according to one embodiment.

FIG. 4 is a flow chart of an exemplary method 400 for stabilizing an impedance injection unit to a power transmission line according to one embodiment. Method 400 may be practiced by a stabilization system that includes a controller and a DC capacitor that stores the energy to be injected into one phase of the transmission line as DC pulses, provided by operation 402. In one embodiment, method 400 may be practiced by stabilization system 20 of impedance injection unit 10 of FIG. 1.

In operation 403, method 400 detects a power flow anomaly by measuring the voltage on the DC capacitor and the phase of current flowing in the transmission line. Power flow anomaly may be due to breakers of the transmission line opening and closing, load variations, inputs to the grid from renewable energy sources turning on and off, component failure or degradation of other impedance injection units, etc. In one embodiment, the stabilization system may monitor the voltage on the DC capacitor in relation to the phase of the current flowing in the one phase of the transmission line into which the stabilization system injects the DC pulses.

In operation 404, method 400 computes a correcting impedance based on the measurement of the voltage on the DC capacitor and the phase of the line current. In one embodiment, the processor of the stabilization system may compute a recursive least squared fit to fit a linear function to a non-linear grid dynamic of the transients on the line current when computing the correcting impedance.

In operation 405, method 400 adaptively adjusts the correcting impedance by recursively adjusting parameters on which the controller operates. In one embodiment, the processor of the stabilization system may adjust the frequency and amplitude of the DC pulses to be injected from the energy of the DC capacitor.

In operation 406, method 400 injects the correcting impedance into the transmission line. In one embodiment, the stabilization system may inject the voltage of DC capacitor as positive-going and negative-going half-cycles of DC pulses into the one phase of the power transmission line. Operations 403, 404, 405, and 406 may be repeated to adaptively adjust the correcting impedance in response to transients on the line current to stabilize the impedance injection unit.

The methods, devices, processing, and logic described above may be implemented in many different ways and in many different combinations of hardware and software. For example, electronic circuitry or a controller may be configured with hardware and/or firmware to perform the various functions described. All or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples. The implementations may be distributed as circuitry among multiple system components, such as among multiple processors and memories, optionally including multiple distributed processing systems.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium.

The foregoing description, for purposes of explanation, uses specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications. They thereby enable others skilled in the art to best utilize the invention and various embodiments with various modifications as are suited to the particular use contemplated. For example, while the stabilization system has been illustrated using a single-phase transmission line of a power distribution grid in order to apply a power flow correction, the principles described are equally applicable to other phases or other alternating current transmission configurations. The examples are thus illustrative and non-limiting. It is intended that the following claims and their equivalents define the scope of the invention.

What is claimed is:

1. An apparatus of an impedance injection unit connected to a power transmission line, comprising:
   a DC capacitor,
   a power switching assembly;
   a controller configured to perform operations including:
      monitor a voltage on the DC capacitor and a phase of a line current flowing through the power transmission line to detect power flow anomalies of the power transmission line; and
      compute a correcting impedance based on the voltage on the DC capacitor and the phase of the line current;
   wherein the controller adaptively commands the power switching assembly using a single control loop to inject the correcting impedance into the power transmission line.

2. The apparatus of claim 1, wherein to compute the correcting impedance based on the voltage on the DC capacitor and the phase of the line current, the controller is configured to proportionally integrate the phase of the line current.

3. The apparatus of claim 1, wherein the power transmission line is part of a power grid and the controller is configured to perform the operations to adapt the impedance injection unit to dynamics of the line current of the power grid.

4. The apparatus of claim 3, wherein the dynamics of the line current of the power grid are non-linear.

5. The apparatus of claim 1, further comprising a phase locked loop.

6. The apparatus of claim 5, wherein to compute the correcting impedance based on the voltage on the DC capacitor and the phase of the line current, the phase locked loop is configured to perform a least-squared fit to fit a linear function to non-linear dynamics of the line current.

7. The apparatus of claim 5, wherein a transfer function of the phase locked loop comprises a $4^{th}$ order transfer function.

8. The apparatus of claim 5, wherein to compute the correcting impedance based on the voltage on the DC capacitor and the phase of the line current, the phase locked loop is configured to lock to the phase of the line current.

9. The apparatus of claim 5, wherein the phase locked loop comprises an orthogonal phase locked loop that uses an orthogonal rotating reference frame to generate an angular frequency error of the phase of the line current.

10. An apparatus of an impedance injection unit connected to a power transmission line that is part of a power grid, comprising:
    a controller;
    a memory containing instructions;
    a phase locked loop configured to lock to a phase of a line current flowing through the power transmission line;
    a power switching assembly configured to inject an impedance onto the power transmission line; and
    a pulse width modulator configured to generate DC pulses that determine the impedance,
    wherein the controller executes the instructions contained in the memory to adaptively control, using a single control loop, the phase locked loop, the power switching assembly, and the pulse width modulator to inject the impedance onto the power transmission line in response to dynamics of the power transmission line.

11. The apparatus of claim 10, wherein the dynamics of the power transmission line are non-linear.

12. The apparatus of claim 11, wherein the phase locked loop is configured to fit a linear function to the non-linear dynamics of the power transmission line.

13. A method for stabilizing power flow of a power transmission line by an impedance injection unit that includes a controller and a DC capacitor that stores energy to be injected, comprising:
    detecting, by the controller, a voltage on the DC capacitor and a phase of a line current flowing through the power transmission line to detect power flow anomalies of the power transmission line;
    computing, by the controller, a correcting impedance based on the voltage on the DC capacitor and the phase of the line current;
    adaptively adjusting, by the controller using a single control loop, the correcting impedance by recursively adjusting parameters of the impedance injection unit; and
    injecting the correcting impedance onto the power transmission line.

14. The method of claim 13, wherein computing, by the controller, a correcting impedance based on the voltage on the DC capacitor and the phase of the line current comprises proportionally integrating the phase of the line current.

15. The method of claim 13, wherein the power transmission line is part of a power grid and wherein adaptively adjusting, by the controller, the correcting impedance by recursively adjusting parameters of the impedance injection unit comprises adaptively adjusting an amplitude and a frequency of DC pulses injected onto the power transmission line in response to non-linear dynamics of the power grid.

16. The method of claim 13, wherein computing, by the controller, a correcting impedance based on the voltage on the DC capacitor and the phase of the line current comprises locking to the phase of the line current using a phase locked loop, and wherein adaptively adjusting, by the controller, the correcting impedance by recursively adjusting parameters of the impedance injection unit comprises adjusting the correcting impedance in response to non-linear dynamics of the power grid as detected by the phase locked loop.

17. The method of claim 16, wherein computing, by the controller, a correcting impedance based on the voltage on the DC capacitor and the phase of the line current further comprises fitting by the phase locked loop a linear function to the non-linear dynamics of the power grid.

18. The method of claim 16, wherein the phase locked loop comprises an orthogonal phase locked loop and wherein computing, by the controller, a correcting impedance based on the voltage on the DC capacitor and the phase of the line current further comprises generating an angular frequency error of the phase of the line current by the orthogonal phase locked loop using an orthogonal rotating reference frame.

19. The method of claim 16, wherein a transfer function of the phase locked loop comprises a $4^{th}$ order transfer function.

20. The method of claim 13, wherein injecting the correcting impedance onto the power transmission line comprises injecting the correcting impedance by a power switching assembly.

* * * * *